United States Patent
Sansbury

(10) Patent No.: US 6,236,597 B1
(45) Date of Patent: May 22, 2001

(54) NONVOLATILE MEMORY CELL WITH MULTIPLE GATE OXIDE THICKNESSES

(75) Inventor: James D. Sansbury, Portola Valley, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/046,720

(22) Filed: Mar. 24, 1998

Related U.S. Application Data

(63) Continuation-in-part of application No. 08/931,975, filed on Sep. 15, 1997, now abandoned.
(60) Provisional application No. 60/026,386, filed on Sep. 16, 1996.

(51) Int. Cl.[7] .................................................. G11C 16/04
(52) U.S. Cl. ............... 365/185.28; 365/185; 365/185.22; 365/185.26
(58) Field of Search ........................... 365/185, 185.28, 365/185.22, 185.26

(56) References Cited

U.S. PATENT DOCUMENTS

| | | | |
|---|---|---|---|
| 4,132,904 | 1/1979 | Harari | 307/238 |
| 4,203,158 | * 5/1980 | Frohman-Bentchkowsky et al. | 365/185 |
| 4,546,454 | 10/1985 | Gupta et al. | 365/200 |
| 4,596,938 | 6/1986 | Cartwright, Jr. | 307/279 |
| 4,609,986 | 9/1986 | Hartmann et al. | 364/200 |
| 4,617,479 | 10/1986 | Hartmann et al. | 307/465 |
| 4,628,487 | 12/1986 | Smayling | 365/185 |
| 4,652,773 | 3/1987 | Cartwright, Jr. | 307/469 |
| 4,677,318 | 6/1987 | Veenstra et al. | 307/465 |
| 4,713,792 | 12/1987 | Hartmann et al. | 364/900 |
| 4,829,203 | 5/1989 | Ashmore, Jr. | 307/469 |
| 4,871,930 | 10/1989 | Wong et al. | 307/465 |
| 4,885,719 | 12/1989 | Brahmbhatt | 365/181 |
| 4,899,067 | 2/1990 | So et al. | 307/465 |
| 4,912,342 | 3/1990 | Wong et al. | 307/465 |
| 4,924,119 | 5/1990 | Lee | 307/469 |
| 4,935,648 | 6/1990 | Radjy et al. | 307/468 |
| 4,958,321 | * 9/1990 | Change | 365/185 |
| 4,979,146 | 12/1990 | Yokoyama et al. | 365/185 |
| 5,005,155 | 4/1991 | Radjy et al. | 365/185 |
| 5,016,217 | 5/1991 | Brahmbhatt | 365/185 |
| 5,021,693 | 6/1991 | Shima | 307/494 |
| 5,028,810 | 7/1991 | Castro et al. | 307/201 |
| 5,043,941 | 8/1991 | Sakamoto | 365/185 |
| 5,097,449 | 3/1992 | Cuevas | 365/228 |
| 5,121,006 | 6/1992 | Pedersen et al. | 307/465 |
| 5,241,224 | 8/1993 | Pedersen et al. | 307/465 |
| 5,247,478 | 9/1993 | Gupta et al. | 365/185 |

(List continued on next page.)

FOREIGN PATENT DOCUMENTS

| | | |
|---|---|---|
| WO 94/22142 | 9/1994 | (WO) . |
| WO 96/01474 | 1/1996 | (WO) . |
| WO 96/01499 | 1/1996 | (WO) . |

OTHER PUBLICATIONS

"Non–Volatile, and High Density Rewritable FPGA Developed Logic Change Becomes Possible on Board," The Nikkei Micro Devices, Jul. 1995, p. 262, and translation.

*Primary Examiner*—David Nelms
*Assistant Examiner*—Connie C. Yoha
(74) *Attorney, Agent, or Firm*—Townsend and Townsend and Crew LLP

(57) ABSTRACT

A nonvolatile memory cell (500) has multiple oxide thicknesses, a tunnel oxide portion (625) and thicker gate oxide portion (630). The memory cell (500) may be used to form compact arrays of memory cells to store logical data. During programming of a selected memory cell, unselected memory cells are not disturbed, and oxide stress for the unselected memory cells is minimized. Techniques for operating programming, erasing, and characterizing the memory cell with multiple oxide thicknesses are discussed.

56 Claims, 8 Drawing Sheets

U.S. PATENT DOCUMENTS

| | | | |
|---|---|---|---|
| 5,260,610 | 11/1993 | Pedersen et al. | 307/465 |
| 5,260,611 | 11/1993 | Cliff et al. | 307/465 |
| 5,350,954 | 9/1994 | Patel et al. | 307/465 |
| 5,353,248 | 10/1994 | Gupta | 365/154 |
| 5,412,599 * | 5/1995 | Daniele et al. | 365/185 |
| 5,444,279 | 8/1995 | Lee | 257/316 |
| 5,457,653 | 10/1995 | Lipp | 365/185.18 |
| 5,527,728 | 6/1996 | Ghezzi et al. | 437/43 |
| 5,757,698 * | 5/1998 | Sakaki | 365/185.22 |
| 5,760,438 * | 6/1998 | Sethi et al. | 257/317 |
| B1 4,617,479 | 9/1993 | Hartmann et al. | 307/465 |

* cited by examiner

NONVOLATILE MEMORY CELL WITH MULTIPLE GATE OXIDE THICKNESSES

This application is a continuation-in-part of U.S. patent application Ser. No. 08/931,975, filed Sep. 15, 1997 now abandoned, which claims the benefit of U.S. Provisional Application No. 60/026,386, filed Sep. 16, 1996, both of which are fully incorporated herein by reference.

BACKGROUND OF THE INVENTION

The present invention relates to the field of integrated circuit memory technology. More specifically, the present invention provides a nonvolatile memory cell with multiple oxide thicknesses and techniques of operating, programming, erasing, evaluating characteristics of the memory cell, and enhancing the reliability and service life of the memory cell.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits (ASICs), among others. Memory cells are used to store the data and other information for these and other integrated circuits.

As integrated circuit technology and semiconductor processing continue to advance, there is a need for greater densities and functionality in integrated circuits, which are often determined in a large part by the size of the memory cells. Further, it is desirable that the memory cells have improved operating characteristics, such as lower power consumption, nonvolatility, greater device longevity, improved data retention, better transient performance, superior voltage and current attributes, and improvements in other similar attributes.

There is a need to provide techniques for programming and erasing the memory cells reliably. For example, during the program operation, memory cells which are not to be programmed should be left undisturbed. There is further a need for improved techniques of evaluating the physical characteristics of nonvolatile memory cells. These physical characteristics or properties are important in the determination of an integrated circuit's service life and reliability. These measurements are also useful for study and use in improving memory cells. One property of a memory cell is margin, including program and erase margin, indicating the degree to which a cell is in a programmed or erased state. The degree of margin comes from a determination of the threshold voltages in the programmed and erased states. In particular, the voltage threshold (VTE) of erased nonvolatile memory cells such as EEPROM or Flash cells may be negative.

As can be seen, improved memory cells and techniques for operating, programming, erasing, and evaluating characteristics of these cells are needed. Improved techniques are also needed for improving the reliability and longevity of these memory devices.

SUMMARY OF THE INVENTION

The present invention provides a nonvolatile memory cell with multiple oxide thicknesses. The memory cell of the present invention may be used to form compact arrays of memory cells to store logical data. During programming of a selected memory cell, unselected memory cells are not disturbed, and oxide stress for the unselected memory cells is minimized. The present invention also provides techniques for operating, programming, erasing, and characterizing the memory cell with multiple oxide thicknesses. Erased nonvolatile memory cells of the present invention may have negative threshold voltages in some implementations. The techniques of the present invention may be used to measure these negative values.

Specifically, the memory cell of the present invention includes: a floating gate; a tunnel oxide beneath the floating gate to facilitate transfer of charge from the floating gate; and a thick oxide beneath the floating gate to prevent disturb effects, where the memory cell retains its stored state when another memory cell coupled to the memory cell is programmed. The tunnel oxide thickness is thinner than the thick oxide thickness. Furthermore, for the memory cell, hot electrons pass through the thick oxide when a programming current is induced from a first n+ region to a second n+ region.

The memory cell of the present invention includes a first oxide portion having a first oxide thickness to permit transfer of charge from a floating gate by tunneling. And, the memory cell further includes a second oxide portion having a second oxide thickness to prevent disturbing of state of the floating gate during operation of the memory cells, while allowing hot electron transfer to the floating gate during programming, where the first oxide portion and second oxide portion are beneath the floating gate.

Furthermore, the present invention provides techniques for operating the memory cell having multiple oxide thicknesses using an elevated source voltage. A voltage of about 2 volts may be coupled to the source of the memory cell to facilitate decoupling of the memory cell during program, erase, or evaluation of margin. Furthermore, the use of elevated source voltages may be used to facilitate the measurement of negative erased threshold voltages, and during the normal operation to adjust a $V_T$ window of the memory cells.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1:
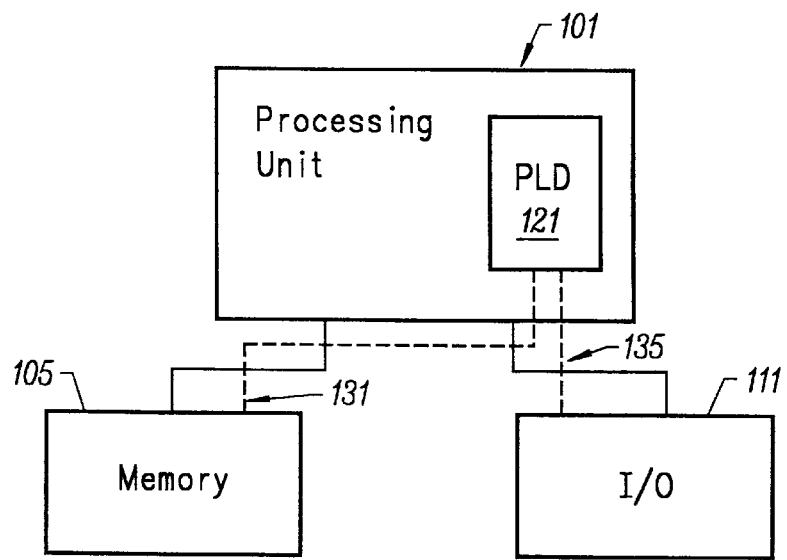
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
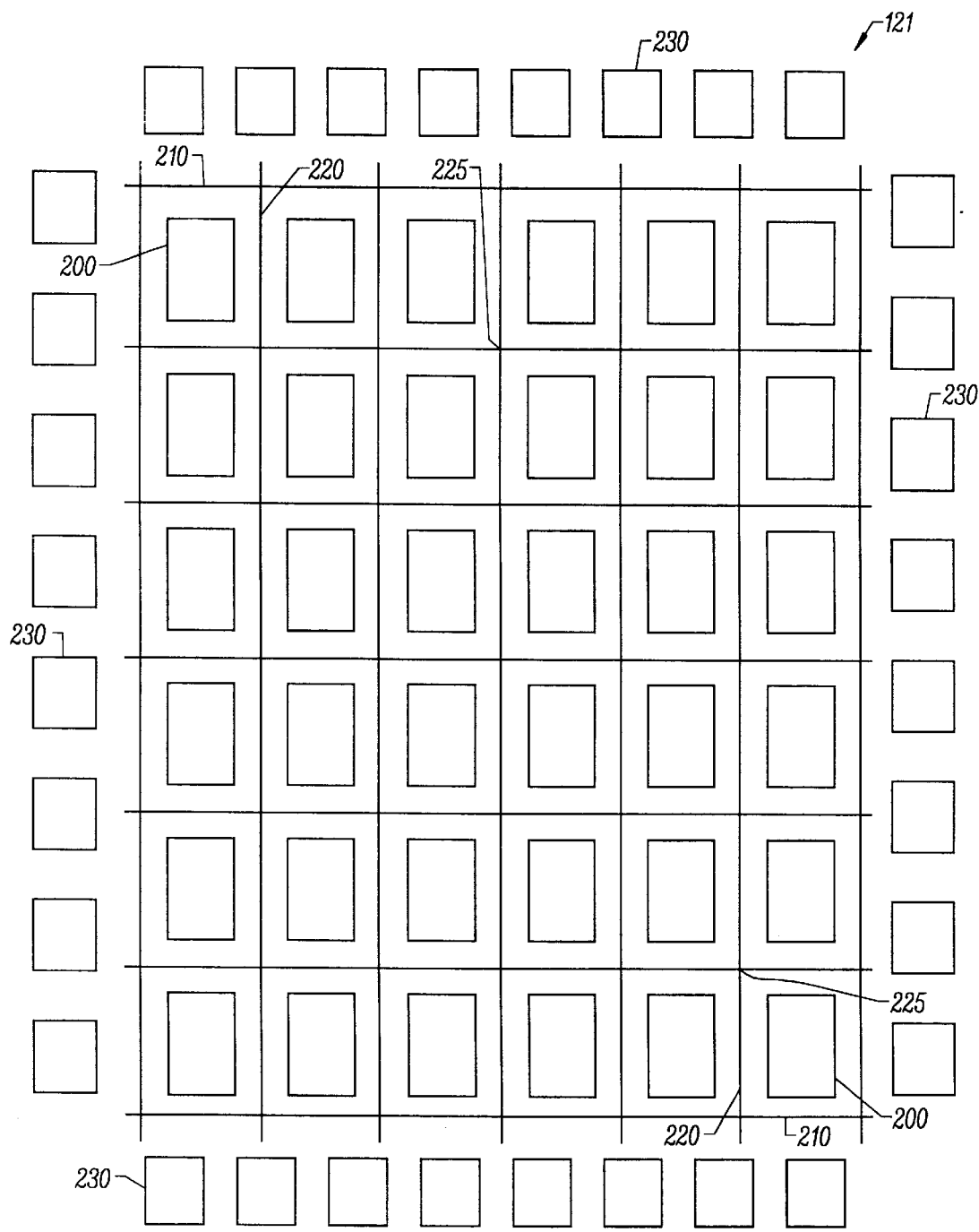
FIG. 2 is a block diagram showing the overall architecture of programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output driver takes internal signals and interfaces them to the outside world. A bidirectional driver performs the functions of both a input driver and an output driver. In addition, a bidirectional driver has a high-impedance mode which allows the driver to interface with a bidirectional bus. In other embodiments of the present invention, a PLD may have dedicated input drivers and dedicated output drivers, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
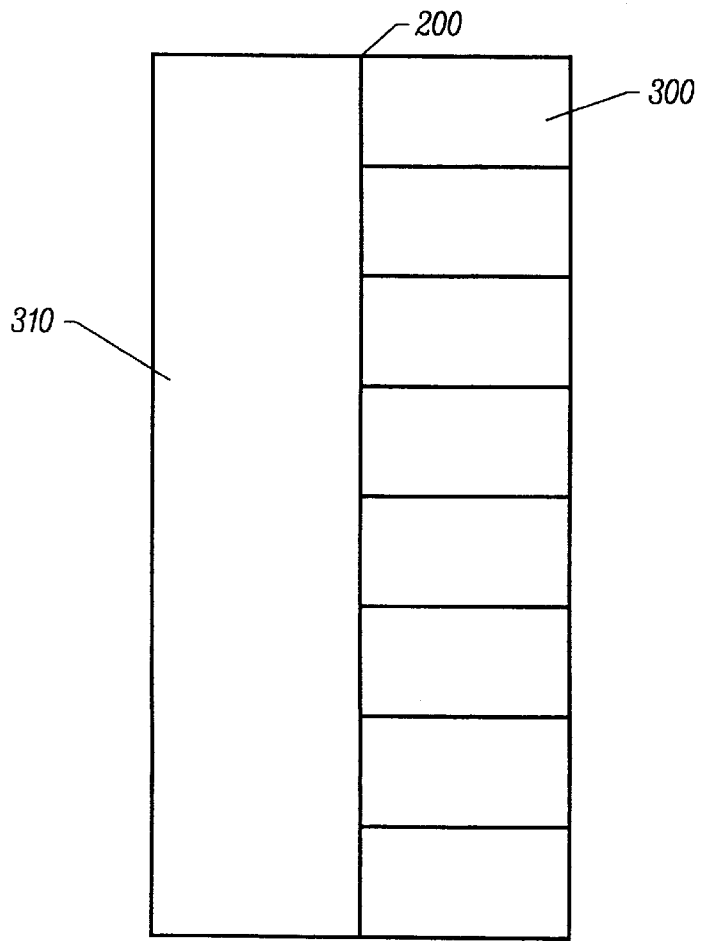
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

A memory cell may be used in various places in a PLD. For example, a memory cell may be used to implement and store the configuration of a look-up table, function generator, programmable interconnect, and other components of the PLD. Using a memory cell, a RAM may be constructed that will be used to implement the look-up tables used in LEs 300. A memory cell may also be as a storage bit. This storage bit may be used, for example, to determine whether an LE is in registered or sequential mode. The storage bit may also be used to configure the operation of a programmable multiplexer.

Figure 4:
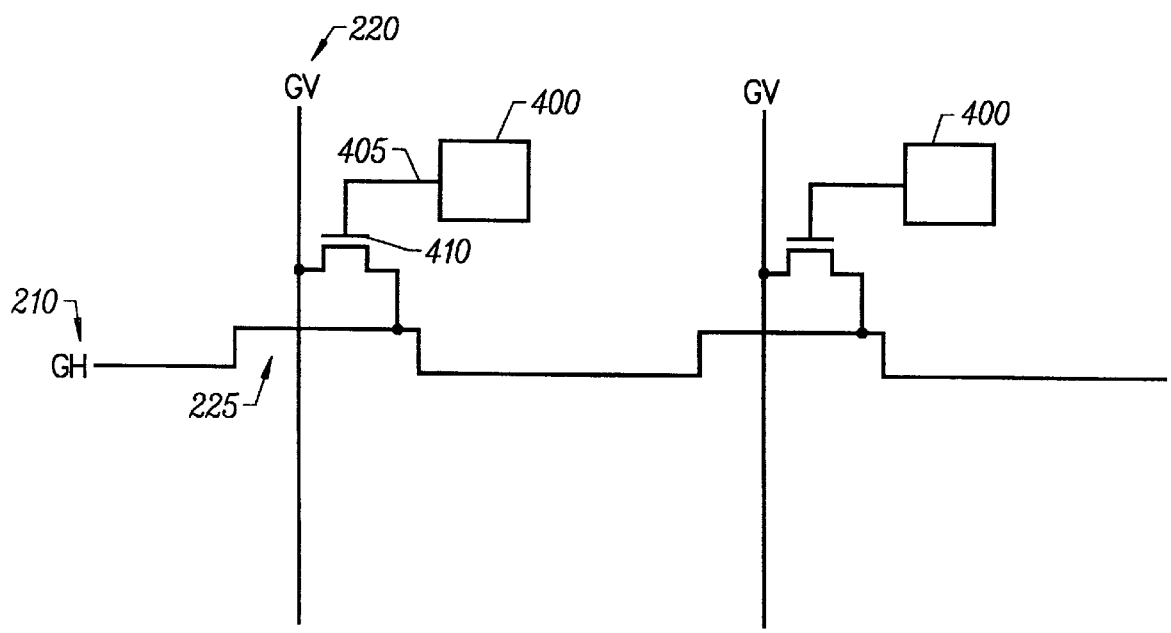
FIG. 4 is a diagram of the memory cell of the present invention used in the programmable interconnect of a programmable logic device.

FIG. 4 is a diagram showing an example of how memory cells may be used in the implementation of the programmable interconnection resources of a PLD, such as shown in FIG. 2. Memory cell 400 is a programmable memory cell. Memory cell 400 stores a logic state, either a high or low logic state. Depending on the polarity of the logic, a logic high state may be a "one" while a logic low state may be a "zero."

Memory cell 400 is reprogrammable, which means that the cell may be programmed many times with new data. Furthermore, in the present invention, memory cell 400 is nonvolatile, which means that the stored information is retained even when power is removed. For example, after memory cell 400 is programmed with a particular logic state, memory cell 400 stores this information indefinitely until the cell is reprogrammed.

Memory cell 400 has an output or sensing node 405 for outputting its stored state. Sensing node 405 provides either a low level or a high level, representative of the state stored in memory cell 400. The voltage levels at sensing node 405 are typically full-rail voltages, about equal to either the VDD (sometimes referred to as VCC) or VSS of the integrated circuit. However, the full-rail voltages at sensing node 405 may also be different from the supply voltages of the integrated circuit. For example, an integrated circuit may have a VDD of 5 volts and a VSS at ground. Memory cell 400 may have "local" supply voltages of 3.3 volts and ground. Then, the output voltage levels at sensing node 405 will be about 3.3 volts and ground.

Memory cell 400 may be used to implement many types of logic elements and components. For example, memory cell 400 may be used to implement a flip-flop, register, storage bit, architecture bit, lookup table, programmable S0 interconnect array, RAM, SRAM, ROM, EPROM, EEPROM, FRAM, content-addressable memory (CAM), PLD, FPGA, PC Card memory card, and other similar memory elements and devices. For example, as shown in FIG. 4, memory cell 400 may be used to implement the programmable interconnection resources of a PLD.

In FIG. 4, GH 210 and GV 220 conductors cross at intersections 225. As is typically the case with global programmable interconnect, GH 210 and GV 220 lines do not connect at intersections 225 unless they are programmably coupled. A pass transistor 410 and programmable memory cell 400 facilitate the programmable coupling of GH 210 to GV 220, and vice versa. In particular, depending on the data stored in memory cell 400, GH 210 and GV 220 conductors are programmably connected or programmably disconnected at intersection 225.

At intersection 225, pass transistor 410 is coupled between GH 210 and GV 220. A gate of pass transistor 410 is coupled to sensing node 405 of memory cell 400. Controlled by way of memory cell 400, pass transistor 410 programmably couples GH 210 to GV 220. For example, GV 220 and GH 210 may be connected together by storing a logic high in memory cell 400. Memory cell 400 would output a high level at sensing node 405, which is passed to the gate of pass transistor 410. A high at the gate of pass transistor 410 turns pass transistor 410 on, so that GV 220 is electrically coupled to GH 210. In the alternative, GV 220 and GH 210 may be disconnected from another by programming a zero into memory cell 400. In this manner, memory cell 400 of the present invention may be used to implement a global programmable interconnect structure for a PLD.

Furthermore, as discussed earlier, the present invention provides full-rail or "local" full-rail voltages at the gate of pass transistor 410. Therefore, pass transistor 45 410 will be either substantially on or substantially off. This allows GHs 210 and GVs 220 to conduct signals throughout the integrated circuit with generally good performance characteristics. For example, when pass transistor 410 is fully on (e.g., the gate is at VDD), the amount of resistance of pass transistor 410 is kept at a minimum, thus improving transient performance. Also, VDD at the gate of pass transistor 410 allows a voltage of about VDD—$V_T$ (a threshold voltage of pass transistor 410, including body effect) from one GH 210 or GV 220 conductor to another. Also, when pass transistor 410 is fully off (e.g., the gate is at VSS), no signals will pass (or "leak") from GH 210 or GV 220 conductor to another. Further, when pass transistor 410 is fully off, the GV 220 conductors intersecting a particular GH 210 conductor will not capacitively load that particular GH 210 conductor. These features improve the performance of the programmable logic device integrated circuit.

Pass transistor 410 may be fabricated using many different process technologies, including CMOS, NMOS, PMOS, and bipolar. In FIG. 4, pass transistor 410 is an NMOS transistor.

Figure 5:
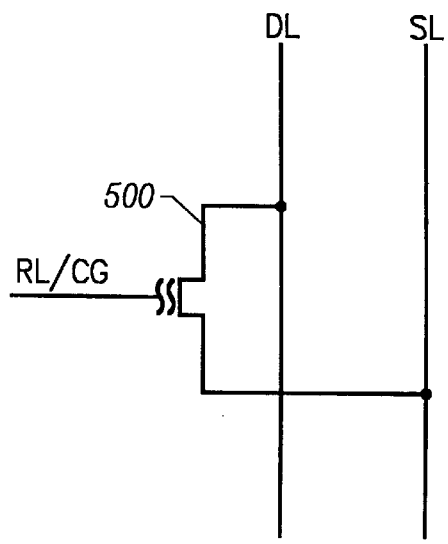
FIG. 5 shows a layout of a memory cell of the present invention having multiple oxide thicknesses.

FIG. 5 shows a diagram of a nonvolatile memory cell 500 of the present invention which may be used to store data. A nonvolatile memory cell retains its stored data even after power is removed from the circuitry. Transistor 500 may be a floating gate device having a floating gate such as a EEPROM or Flash cell. FIG. 5 shows an example of a layout for memory cell 500. Memory cell 500 is coupled between a drain line (DL) and an source line (SL). A control electrode of memory cell 500 is coupled to a row line/control gate line (RL/CG).

Memory cell 500 is a double-polysilicon floating gate transistor with multiple oxide thicknesses. In the present invention, to achieve efficient tunneling erasure and at the same time avoid drain disturb effects, this invention involves constructing the floating gate transistor with a tunneling oxide on the source side of the device, while employing a thicker gate oxide on the drain side of the device.

In particular, a drain side of memory cell 500 has a thicker gate oxide than at source side of memory cell 500. The thinner gate oxide at the source side may be referred to as a "tunneling oxide" region since this is the region where electrons will travel from the floating gate to effect erase of the memory cell. The drain side of the memory cell is connected to DL, and the source side is connected to SL. A dual-thickness gate oxide single transistor cell can be programmed, erased, and margined safely in an array with the required isolation of unaccessed cells during programming and margining, and without disturb effects.

Although the present invention is described having dual-oxide thicknesses, transistors according to the present invention may have multiple oxide thickness, possibly more than two thicknesses. The techniques of the present invention would also apply to transistors having more than two thicknesses.

In a specific embodiment, a channel length of memory cell 500 may be longer than a minimum channel length allowed by the process technology. Depending on the process technology used, a longer than minimum channel length may allow fabrication of a device having multiple oxide thickness. Furthermore, the layout of the transistor channel, while longer than a minimum device, is such that the overall cell size is still quite small. Using the techniques of the present invention, a read transistor is not necessary to isolate the memory cell from the DL line. Therefore, compact arrays may be constructed.

Figure 6:
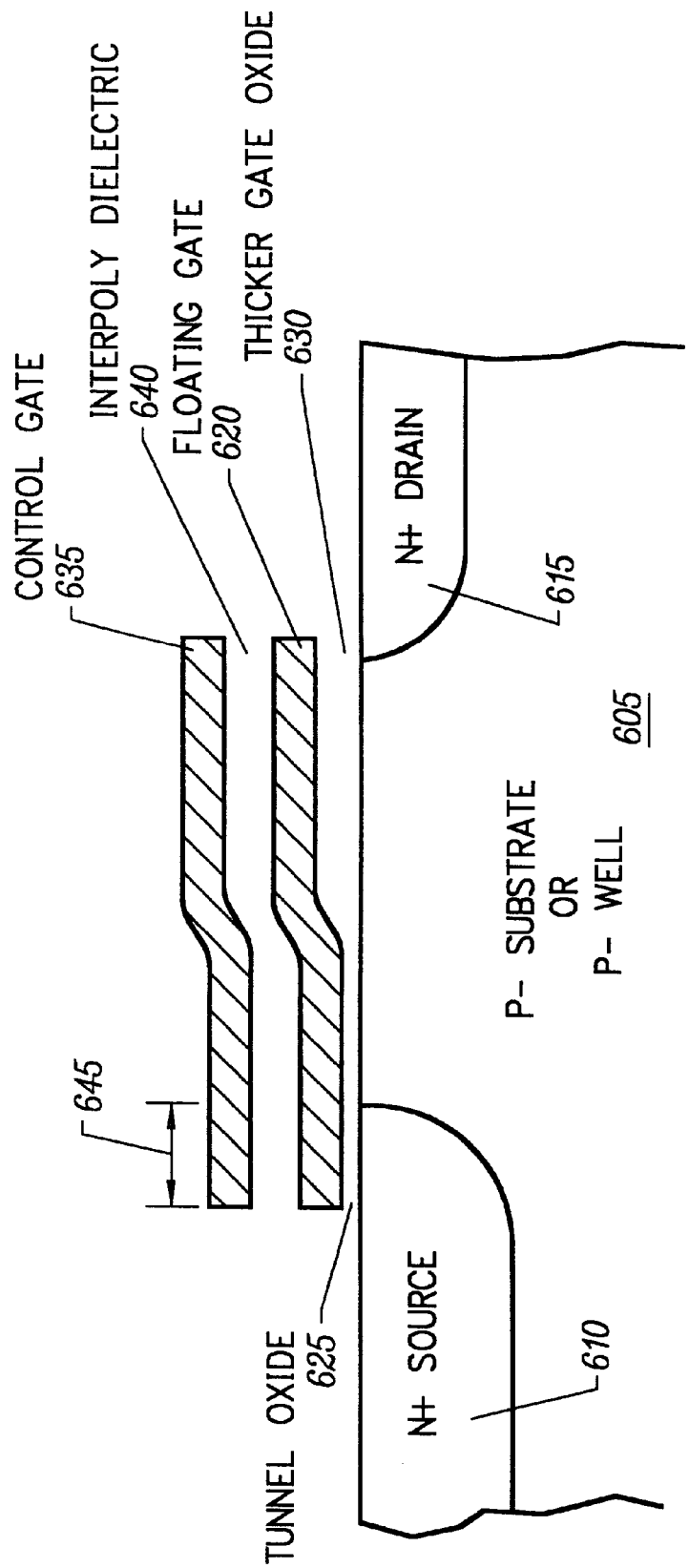
FIG. 6 shows a cross section of a memory cell of the present invention.

FIG. 6 shows a cross section of memory cell 500 transistor of the present invention. In a specific embodiment, memory cell 500 is formed in a p-substrate or p-well 605. Memory cell 500 has a n+ source region 610 and n+ drain region 615. Between source region 610 and drain region 615 in the substrate is a channel region of the transistor. A floating gate 620 is formed on the substrate. On the source side, a thickness of a tunnel oxide 625 between the surface of the substrate and floating gate 620 is thinner than a thicker gate oxide 630 thickness. Beneath the floating gate and above the surface of the substrate, thin tunnel oxide 625 is above a portion of the channel region which is adjacent the source. Thicker gate oxide 630 is above a portion of the channel region which is adjacent the drain. Although in FIG. 6 the transition point between thick and thin oxide is shown to occur over the channel region between the source and drain, it could equally well occur over the source, so that the entire channel region underlies the thick oxide.

Between a control gate 635 and floating gate 620 is an interpoly dielectric 640. Tunneling oxide 625 may be approximately 90 Angstroms. Thicker gate oxide 630 on the drain side of the device may be 125 Angstroms or more. The thickness of thicker gate oxide 630 may be chosen to match a thicker oxide already required or available in a particular process.

The tunnel oxide or dielectric may be about 80 Angstroms to about 100 Angstroms. In other embodiments, the tunnel dielectric may be about 100 Angstroms to about 110 Angstroms. The tunnel dielectric thickness is dependent on many factors such as the process technology, and the supply voltage for the technology (e.g., 5-volt process, 3.3-volt process, 2.5-volt process, 1.8-volt process, or lower). In comparison, using present-day process technology, a gate oxide of typical enhancement transistors will typically be about 50 Angstroms to about 70 Angstroms, or thinner.

In a specific embodiment, floating gate 620 overlaps source 610 as indicated in FIG. 6 by an overlap region 645. Overlap region 645 may be about 0.2 microns, or more. Alternatively, it could be less than 0.2 microns, for example 0.1 microns. This overlap permits the transfer of electrons between the source region and the tunnel oxide. Electrons may be removed from the floating gate by transfer of electrons in the overlap region through tunnel oxide 625 (from floating gate 620 to source 610).

Depending on the process technology used, thicker gate oxide 630 may be thicker, the same as, or thinner than a gate oxide of a typical enhancement transistor fabricated on the same integrated circuit. Furthermore, tunnel oxide 625 may also be thicker, the same as, or thinner than the gate oxide for a typical enhancement transistor. As process technology improves, gate oxide thicknesses for memory transistors may not scale with the gate oxide thickness for typical enhancement transistors used to implement logic. It is expected tunnel oxide 625 will be thicker than the gate oxide of a typical enhancement transistor.

As discussed above, FIG. 5 shows a simplified layout of a memory cell 500. There are many other layout organizations for the memory cell of the present invention, depending on the process technology used, silicon area available, performance criteria, and other factors. The principles of the present invention would be applicable to other layouts and configurations of memory cells, with suitable changes.

Figure 7:
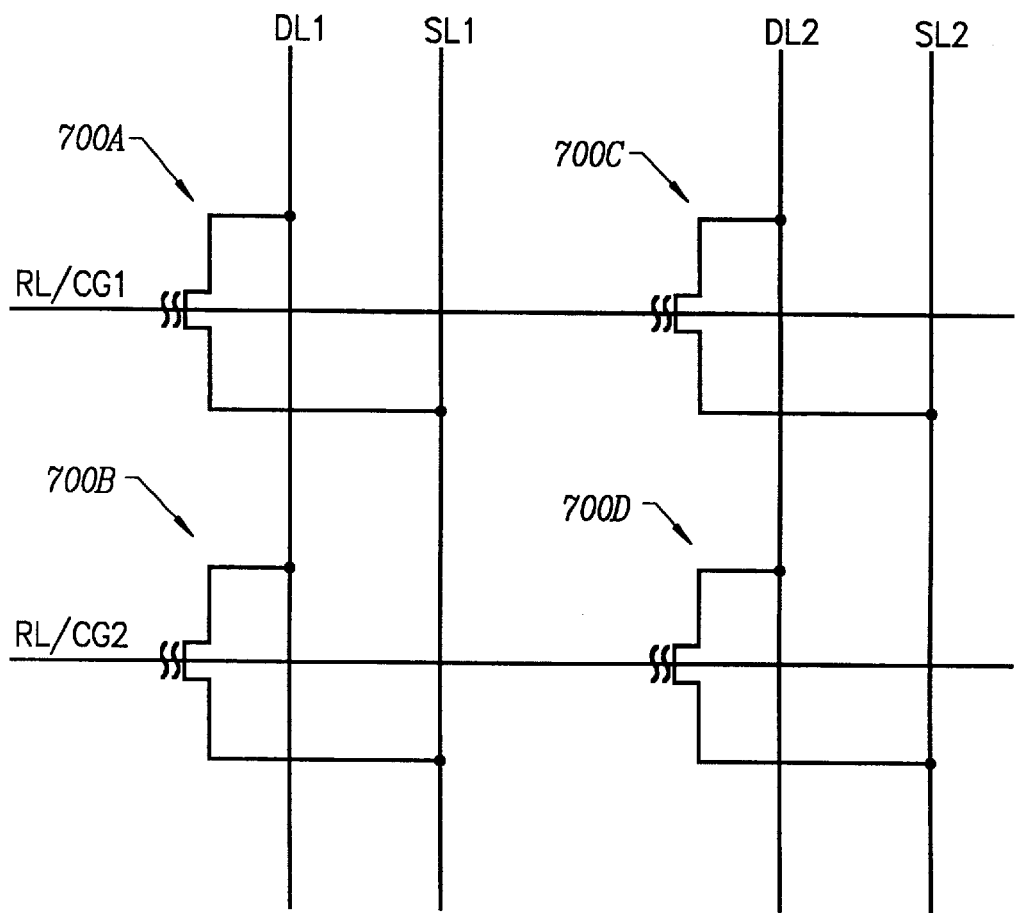
FIG. 7 shows an array of memory cells of the present invention.

Furthermore, an array of memory cells may be formed by replicating (and possibly mirroring) a single cell in vertical and horizontal directions, such as shown in FIG. 7. Using this technique, an array of any arbitrary desirable size may be formed. For example, an array may be arranged in 2×2 (e.g., FIG. 6), 1024×8, 16M×1, or many other organizations. The particular organization may also be reconfigurable or dynamically reconfigurable, selected by the user. A particular cell in the array may be selectively accessed or configured by row and column. One technique, among others, is to access cells through row and column address and decoding. For example, RL/CG is decoded using a row decoder.

FIG. 7 shows a 2×2 array of memory cells. There are four memory cells 700A, 700B, 700C, and 700D. Memory cells 700A and 700B are coupled between DL1 and SL1. Memory cells 700C and 700D are coupled between DL2 and SL2. A RG/CG1 line is coupled to control gates of memory cells 700A and 700C. A RG/CG2 line is coupled to control gates of memory cells 700B and 700D.

Although FIGS. 5–7 show implementations of a memory cell using NMOS technology, the principles of the present invention will apply analogously to the case where transistor 500 is a PMOS or p-channel device.

Figure 8:
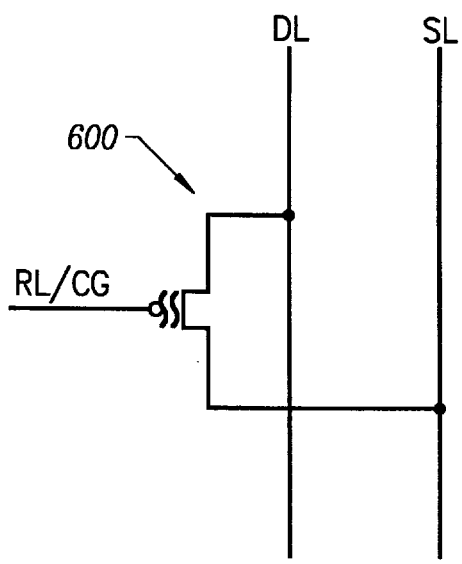
FIG. 8 shows a layout of a memory cell of the present invention using PMOS technology.

Specifically, FIG. 8 shows such a configuration, where transistor 800 is a PMOS device. This detailed description discusses operation primarily with respect to an NMOS version of the memory cell, which is generally more widely available. However, it is understood that this discussion of an NMOS memory cell would apply similarly (by duality) to the PMOS device configuration.

For example, for the PMOS device configuration, memory cells will be initialized to an erased state by quantum-mechanical tunneling (from the floating gate to source) as would be the case of NMOS devices. To effect tunneling in the PMOS configuration, the floating gate should be at a negative voltage (i.e., −VEE) and source should be grounded. As is the case for NMOS memory cells, hot electron programming is used to selectively program PMOS memory cells. To generate hot electrons in the PMOS configuration, the floating gate should be positive (i.e., VPP) and the drain is negative. Furthermore, hot electrons are generated using avalanche breakdown instead of channel hot electrons.

Figure 9:
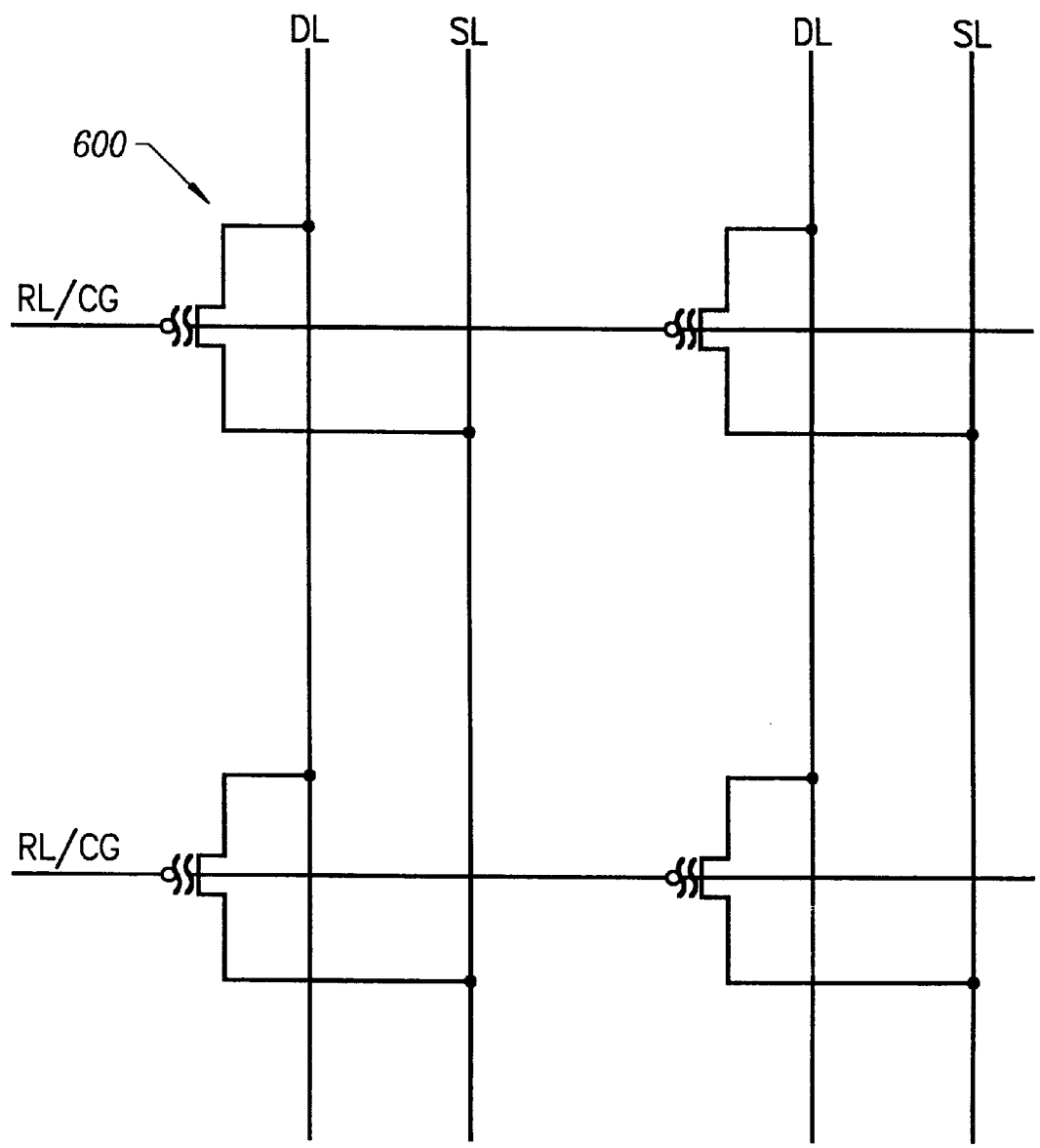
FIG. 9 shows an array of memory cells of the present invention using PMOS technology.

FIG. 9 shows an array of PMOS memory cells 800, arranged in rows and columns, similar to the array of NMOS memory cells in FIG. 7.

Figure 10:
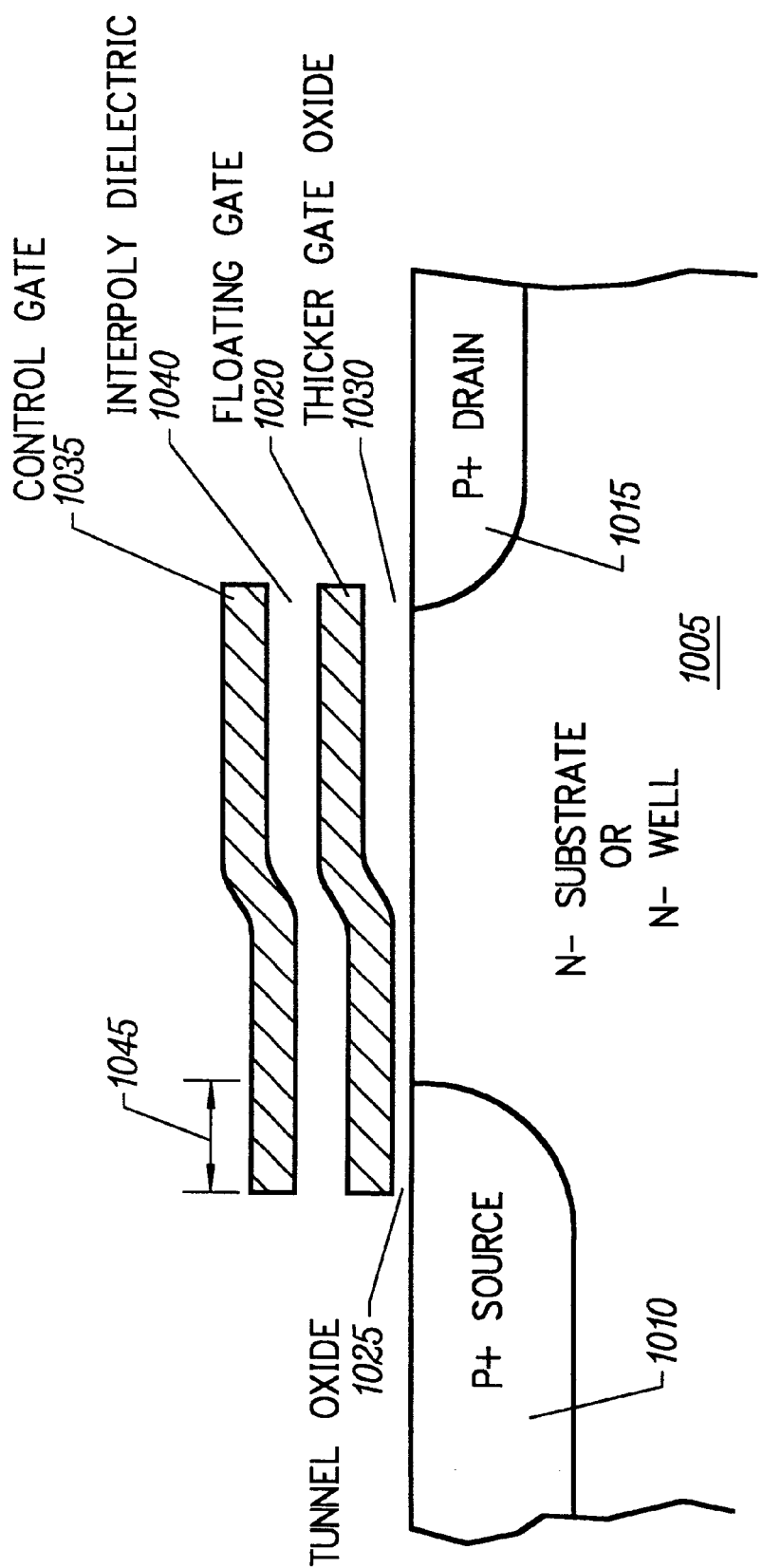
FIG. 10 shows a cross section of a memory cell of the present invention fabricated using PMOS technology.

FIG. 10 shows a cross section of a PMOS memory cell of the present invention. In a specific embodiment, PMOS memory cell 800 is formed in an n-well or n-substrate 1005. Memory cell 800 has a p+ source region 910 and p+ drain region 915. A floating gate 1020 is formed on the substrate. On the source side, a thickness of a tunnel oxide 1025 between the surface of the substrate and floating gate 1020 is thinner than a thicker gate oxide 1030 thickness. Between a control gate 1035 and floating gate 1020 is an interpoly dielectric 1040. The tunneling oxide may be approximately 90 Angstroms. The oxide on the drain side of the device may be 125 Angstroms or more. This may be chosen to match a thicker oxide already required or available in a particular process.

In a specific embodiment, floating gate 1020 overlaps source 1010 as indicated in FIG. 10 by an overlap region 1045. Overlap region 1045 may be about 0.2 microns, or more. Alternatively, the overlap region could be less than 0.2 microns, for example 0.1 microns. This overlap permits the transfer of electrons between the source region and the tunnel oxide. Electrons may be removed from the floating gate by transfer of electrons in overlap region 1045 through tunnel oxide 1025 (from floating gate 1020 to source 1010).

Depending on the process technology used, thicker gate oxide 1030 may be thicker, the same as, or thinner than a gate oxide of a typical enhancement transistor fabricated on the same integrated circuit. Furthermore, tunnel oxide 1025 may also be thicker, the same as, or thinner than the gate oxide for a typical enhancement transistor. As process technology improves, gate oxide thicknesses for memory transistors may not scale with the gate oxide thickness for typical enhancement transistors used to implement logic.

Returning to FIGS. 5–7, by appropriately configuring memory cell 500, a binary "0" or "1" is stored. Memory cell 500 is nonvolatile so that the stored data is retained even when power is removed from the integrated circuit. The stored data may be read from the cell and used for many purposes. For example, in a programmable logic device, the stored data may be used to determine whether a GH line is coupled to a GV line, or may be used to perform logic using gates, product terms, function generators, and look-up tables, to name just a few. Memory cell 500 may also be used in other types of integrated circuits such as microprocessors, memories, DSPs, and ASICs.

The configuration of memory cell 500 involves programming or erasing this memory cell. Depending on the memory technology used, the terms "programmed" and "erased" may have different meanings. In this specification, the IEEE convention for these terms is used. Specifically, "programmed" refers to placing electrons onto the floating gate, and "erased" refers to removing electrons from the floating gate. For the case of NMOS, the programmed state is nonconducting and the erased state is conducting. High voltages or currents, or both, may be used to transfer charge to and remove charge from the floating gate through the tunnel oxide or thick oxide dielectric by various physical mechanisms such as avalanche injection, channel injection, direct quantum-mechanical tunneling, Fowler-Nordheim tunneling, hot electrons, and other phenomena.

There are many considerations when operating, programming, and erasing memory cells, and these considerations are important in understanding the present invention. Further details of the operation, program, and erase of nonvolatile devices such as EEPROM and Flash cells are discussed in U.S. Pat. No. 5,581,501, application Ser. No. 08/701,416, and application Ser. No. 08/741,082, all incorporated herein by reference in their entirety for all purposes.

High voltages facilitate the program and erase of the memory cell. A high voltage (VPP) used to program the memory cell may be somewhat different from a high voltage (VEE) used to erase the memory cell. The magnitude of VPP and VEE depends on the physical characteristics of the memory cell including such considerations as the thickness and composition of the dielectric between the substrate and the floating gate. Typically, VPP and VEE voltages are in the range of approximately 10 volts to 16 volts. However, as process technology continues to improve, it will become possible to fabricate thinner and better tunnel oxide dielectrics. Consequently, the high voltages needed to program and erase the memory cell may decrease in magnitude. These high voltages may be generated on-chip by circuits such as charge pumps or voltage generators; or provided from sources external to the integrated circuit.

To erase memory cell 500, charge is electrically removed from the floating gate using high voltages and quantum-mechanical tunneling. After erasure, the program device may be reprogrammed. Flash EEPROM cells are generally programmed using hot electrons, while EEPROM cells are programmed using quantum-mechanical tunneling. In some cases, Flash EEPROM cells are programmed using quantum-mechanical tunneling. EEPROM and Flash cells may be programmed, erased, and reprogrammed many times for the lifetime of the device.

The memory cell shown in FIG. 5 in a preferred embodiment uses Flash cells. When using Flash cells, the RL/CG line in FIG. 5 should be decoded. When the memory cell is programmed, charge is placed on a floating gate and in so doing, the memory cell is placed in a high threshold voltage state (VTP or high $V_T$). The floating gate retains this charged state indefinitely, even when power is not supplied to the memory cell; this provides nonvolatility. In the programmed or high $V_T$ state, a reasonable voltage on RL/CG will not turn on memory cell 500.

A reasonable voltage may be, for example, a voltage between the supply voltages of the integrated circuit, VDD and VSS; memory device 500 will not conduct. A reasonable voltage may also be greater than VDD. However, in the case when a voltage above VTP is placed at CG, the program device may turn on. For EEPROM and Flash EEPROM technology, the typical threshold voltage for a memory cell in a high $V_T$ state (i.e., VTP) is, for example, approximately 6 volts. For example, with RL/CG at 2 volts, in the high $V_T$ state, program device 515 will be nonconducting or off.

When erasing the memory cell, charge is removed from the floating gate, and the memory cell is placed in a low $V_T$ state (VTE). The floating gate retains this erased state for the life of the memory cell, even when power is not supplied. In the erased or low $V_T$ state, a reasonable voltage on a gate of the memory cell will turn the memory cell on. For Flash EEPROM technology the typical threshold voltage for a low $V_T$ state ranges from approximately 0.5 volts to 2.5 volts. For EEPROM technology, this may range from approximately −3 volts to 0 volts.

When erasing using a "smart" algorithm, a specific low $V_T$ voltage level state may be achieved. For example, the VTE may be about −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, highcapacity Flash EEPROM memories. In other applications such as programmable logic devices, a negative low $V_T$ state may be allowable. For example, a negative VTE may be desirable in order to permit pass transistor 410 (in FIG. 4) to pass approximately full-rail voltages (e.g., VCC or VDD) between a GH and a GV. In this case, the program device would be analogous to an NMOS depletion device.

Typically, arrays of programmable cells are "initialized" to a particular first state, and then they are configured by changing selected cells to a second state. The initiation state of an array is chosen based on many considerations including the process technology selected to fabricate the cells and the intended use of the cells, as well as the interconnections within an array. For example, Flash EEPROM cells are typically initialized by bulk erasing the cells to a low $V_T$ state. In contrast, an array of EEPROM cells is typically initialized by bulk programming the cells to a high $V_T$ state.

RL/CG activates memory cell 500. During normal operation, RL/CG is coupled to a voltage level which activates and enables operation of the memory device. To activate memory cell 500, CG is coupled to a voltage level which is greater than VTE and less than the VTP. The voltage at the control gate may also be used to center a window of operation of the memory cell. For example, for typical EEPROM technology, a control gate voltage should be above about −1 volts (VTE) and less than about 5 volts (VTP). The control gate may be coupled to a switching signal line, which provides voltages between VSS and VDD. The control gate voltage may also be above VDD. This may be used to improve performance of the memory cell.

In a preferred embodiment, to provide the greatest amount of programming and erase margin, the control gate voltage is selected to be at approximately the center of VTE and VTP. For example, the control gate voltage is set in the range from about 1 volt to about 3 volts. An activation voltage above VDD may also be used because among other reasons, this may be required by the memory element, or a higher voltage level is readily available. Also, this voltage level may center the window of operation of the memory cell. The control gate is also used during the programming of the memory cell, which is described in more detail below.

When utilizing EEPROM and Flash EEPROM technologies, the memory cell is erased using Fowler-Nordheim tunneling. For Flash operation, the memory cell is initialized to an erased state. VEE is placed at SL. As discussed earlier, VEE is a high voltage used for erasing the devices. VEE is typically in the range of 10 volts to 16 volts. DL may be floating, grounded, or placed at VEE. RL/CG is held at a low voltage, grounded or negative. When erasing, a negative assist programming technique may be used by placing a negative assist voltage on the control gate. For example, a voltage of −3 volts may be placed on RL/CG. This would decrease VTE, improving the erase margin of the memory cell.

Referring to FIG. 6, tunnel oxide 625 is positioned above source region 610. In operation, from source region 610 (an n+ region), electrons may tunnel, in both directions, through the tunnel dielectric via quantum-mechanical tunneling to and from floating gate 620. High voltage VEE at source 610 attracts electrons from the floating gate 620 via Fowler-Nordheim tunneling. This makes floating gate 620 more positively charged, and places memory cell 500 in a low $V_T$ state. The VTE may be approximately −2 volts.

Memory cells 500 may be blanket erased or selectively erased to the erased state by placing an appropriate voltage on RL/CG. For example, for cells not be erased, the RL/CL may be placed at or above the VEE voltage.

Using Flash technology, the memory cells in an array of such devices are selectively programmed using hot electrons. To program, the memory cell is placed in a high $V_T$ state. Various considerations during programming include permitting the programming of the memory cells while at the same time not disturbing other memory cells in the array; i.e., unselected memory cells may be unintentionally disturbed by way of tunneling, hot electrons, oxide stress, and other mechanisms.

The techniques of the present invention allow programming of selected cells without disturbing or accessing other cells. Specifically, isolation of nonaccessed cells during programming and margining operations is achieved through the use of source bias, for example on the order of 2 volts. By raising the source voltage, the depletion or low $V_T$ state can be cut off, and particular cells can be isolated for programming or margining. A discussion of elevated source voltages for evaluating margin of memory cells is presented in application Ser. No. 08/915,519, filed Aug. 14, 1997, incorporated herein by reference in its entirety for all purposes. Similar techniques may be used during the programming, erase, and margin testing of the memory cell of the present invention.

The use of positive source voltages is especially useful when the memory cells have a negative $V_T$ in the erased state. Raising the source voltage requires a corresponding increase in the drain voltage during hot electron programming, for example to approximately 8 volts instead of a more typical 6 volts.

For example, referring to FIG. 7, to program device 700A, SL1 may be placed at an elevated source bias voltage of about 2 volts in order to ensure cell 700B is not accessed or disturbed during the program operation. DL2 and SL2 may be grounded, or may also be placed at a voltage of 2 volts or more, such as VDD or 5 volts, in order to prevent undesired programming of memory cells 700C and 700D.

VPP is placed on RL/CG1. As discussed earlier, VPP is a high voltage used for programming the memory cells. VPP is typically in the range of about 12 volts to about 18 volts, taking into account a source bias voltage of 2 volts. This voltage also depends on the technology used, and may be lower, such as 10 volts.

A VPD voltage is placed on DL1. VPD is selected to optimize the efficient programming of the devices. These considerations include ensuring that program device 515 is programmed well, minimizing any destructive effects on the devices, and observing the current density constraints of the power conductors. In one embodiment, VPD is about 8 volts, taking into account the source bias voltage. However, VPD may be in the range from about 5 volts to about 11 volts. SL1 is at the source bias voltage (i.e., 2 volts). To avoid programming memory cell 700B, RL/CG2 is grounded (or at a negative voltage, if available). Memory cell 700B is decoupled from DL1, even if memory 700B has a negative VTE, provided sufficient source bias is used.

Under these conditions, the source for memory cell 700A is at 2 volts; a significant current flows from DL1 through memory cell 700A to SL. For example, this current may be about five hundred microamps, or more. For example, the current may be in the range from about five hundred microamps to seven hundred microamps. The range may be from about one hundred microamps to about one milliamp. There are devices which will program with currents of a few microamps, such as about one microamp to about 10 microamps or more. As technology improves, memory cells will be developed which will program with any desired range of currents. This current generates hot electrons, some of which jump the thin tunnel oxide dielectric barrier (i.e., gate oxide or thin oxide) and become trapped in the floating gate of cell 700A. The floating gate becomes negatively charged. Memory cell 700A is programmed to a high $V_T$ state. VTP is typically 5 volts or higher.

It is an important consideration when programming selected memory cells in an array of memory cells to avoid altering or disturbing the programmed or erased state of the unselected memory cell. It is desirable that the unselected programmable cells remain in their programmed or erased state. A potential problem is that the voltages and conditions used to induce the programming current for programming a memory cell by hot electron programming may disturb other memory cells (possibly in the same row or column). For example, this voltage may erase unselected memory cells by Fowler-Nordheim tunneling. A technique of minimizing this disturb phenomenon is to fabricate the memory cell with a thicker tunnel oxide. This increases the voltage necessary to possibly disturb the devices by Fowler-Nordheim tunneling.

The techniques and memory cell configuration of the present invention avoid or minimize disturb, while at the same time provide ease of programming and erasure. Specifically, when programming memory cell 700A, a VPP at DL1 places a significant stress on the gate oxide of the drain side of memory cell 700B (which may be previously programmed device having a floating gate voltage of −2 volts to −3 volts). In the present invention, a thicker gate oxide is provided on the drain side of the memory cell in order to handle the stress, and prevent disturb effects. A thicker gate oxide 630 (in FIG. 6) on the drain side will be more tolerant to high voltage stresses compared to a thinner oxide such as tunnel oxide 625. The thin tunnel oxide 625 permits ease in erasure. As can be seen, the memory cell of the present invention provides the advantages of a thick oxide device with the erasability of a Flash memory cell in a single compact cell size.

When the erase voltage VTE of the memory cells is not negative, the memory cell of the present invention may also be programmed and erased using techniques described for single transistor Flash memory cells (e.g., without use of source bias voltages) in the references discussed above and incorporated herein by reference.

During the fabrication and production of integrated circuits containing the memory cell of the present invention, it is desirable to test and verify the programming and erase margins of the memory cells. Programming and erase margin are the degree to which a cell when in one state (i.e., programmed or erased), may be differentiated from the other state. If there isn't sufficient programming margin, then the circuitry may be unstable; for example, a cell will only sometimes be in the desired or configured state depending on temperature and voltage conditions. Or, the circuitry may completely fail functionally. For example, when exercising a configured memory cell, this cell will not function as desired, causing logical errors. Hence, margin testing is important for ensuring the reliability and integrity of the circuitry on the integrated circuit. Margin evaluation may be performed on memory cell using similar techniques as described in application Ser. No. 08/915,519.

Specifically, a method of margin testing a memory cell such as shown in FIG. 5 involves the following. During testing, a memory cell, such as 700A, is selected, and its margin is evaluated. There are many considerations when margin testing. For example, testing of margin could be influenced by other components coupled to the same control lines, causing inaccurate results. This is a similar problem as not disturbing adjacent memory cells when programming and erasing memory cells. It is important that margin is accurately measured for the desired cell, and the results are not influenced by contributions, leakages, and other currents from other cells. Further, it is generally desirable to minimize any additional circuitry used to evaluate margin. This additional circuitry would unduly impact speed path performance due to increased loading, as well as other similar considerations.

To margin test, a memory cell 700A to be tested is selected. Erase and program margin are evaluated similarly. For erase margin, the memory cell is initially in an erased state. For program margin, the memory cell is initially in a programmed state. To evaluate margin, DL1 is set to about 1 to 2 volts. SL1 is grounded. RL/CG1 is used to select a memory cell 700A for testing and verification. RL/CG2 is set at a voltage which will deselect or turn off memory cell 700B. A voltage supplied at RG/CG1 is swept until memory cell 700A begins to conduct. This voltage is the threshold voltage for erase or program, depending on the state of the cell. This threshold voltage is an indication of the programming margin of the memory cell.

To determine a near zero or negative VTE, negative voltages may be used to sweep RL/CG. A voltage range (including negative and positive voltages) is swept at CG to find the voltage at which the selected cell begins to conduct. For example, the voltage on CG may be swept from −3 volts to 2 volts. A negative voltage may be generated on-chip by a charge pump or other circuitry, or supplied from an external source. For the memory cell where negative voltages are coupled to CG, the control gate electrode should be wired in polysilicon rather than diffusion to prevent forward biasing a diode in the substrate (e.g., diode between n+ diffusion to p-substrate or p-well).

Another technique for determining a near zero or negative VTE is through the use of substrate bias. Specifically, for example, a p-well or substrate which contains memory cell 700A may be negatively biased. From principles of the semiconductor physics for transistors, as the body bias of a transistor becomes increasingly negative, the $V_T$ (being a function of body bias) increases. The function of $V_T$ versus VSB (substrate bias from source to bulk) is characterized by equations found in textbooks on semiconductor physics.

That is, $\alpha V_T$, the increase in $V_T$ as $V_{SB}$ increases, is given by $\alpha V_T = \alpha[(\beta + V_{SB})^{1/2} - \beta^{1/2}]$, where $\alpha$ and $\beta$ are constants of the structure which are determined by the gate oxide thickness and the dopant distribution in the transistor substrate.

A further technique of the present invention for measuring margin, especially for determining a near zero or negative VTE is through use of substrate bias by elevated source voltage during sensing. Using these equations, given the substrate bias and voltages at the control lines of the memory cell, the VTE (at zero substrate bias) may be calculated. Hence, the margin may be evaluated using negative substrate biases. By using negative substrate biases, this technique has the advantage that negative voltages on the control lines are not required, and it will work with typical memory cells (including single transistor cells); the memory cells do not require any additional or special processing to use this technique. It has the further advantage that the gate voltage at $V_T$ is shifted positively by the sum of the $\alpha V_T = \alpha[(\beta + V_{SB})^{1/2} - \beta^{1/2}]$ for body bias discussed above, plus the entire value applied to $V_S$ (the voltage at the source node).

The technique involves elevating SL1 or source node of the memory cell 700A by a positive voltage or offset voltage. When a positive voltage is coupled to SL, without changing voltage coupled to the substrate (e.g., zero volts), there will be effectively a back bias, or positive VSB. Therefore, with an offset voltage on SL, this situation becomes similar to that of negative back biasing discussed above. Equations may be used to calculate the VTE at zero substrate bias, or zero source bias. Negative control line voltages (e.g., CG) are not necessary to evaluate the margin of memory cell 700A. And, a negative VTE (at zero substrate bias) of several volts is measurable using this approach. This technique does not require negative voltages to be coupled to CG or the substrate.

When the source voltage (at SL) is elevated, referring to FIG. 7, the voltages at RL/CG and DL should be adjusted accordingly in relationship to the source voltage. For example, if the source voltage is 1 volt, the voltages coupled from RL/CG and DL should be elevated by about 1 volt in order to place the memory cell in a similar condition as in the case when the source voltage was ground. In other words, the elevated source voltage acts as an offset voltage. For example, when the source voltage is 1 volt and CG is coupled to ground, there is effectively a −1 volt VGS (gate-to-source voltage) bias on memory cell 700A. In a specific embodiment, the offset voltage for the source node of memory cell 700A is selected so that the VTE of the memory cell may be measured without using negative RL/CG and substrate voltages.

The use of source bias voltages is also useful to ensure unselected memory cell transistors are turned off, and effectively decoupled from the DL and SL lines. Specifically, memory cell 700B may be decoupled by using an elevated source voltage at SL1, sufficient to turn off memory cell 700B when a zero (or slightly positive) voltage is placed at CG/RL2 of memory cell 700B. By placing a voltage of at least a $|V_T|$ of an erased memory cell (i.e., $|VTE|$) at the SL or source of memory cell 700B, this will ensure a zero or slightly positive voltage at CG/RL2 of memory cell 700B will turn the cell off, thus decoupling it from the DL line.

Furthermore, the positive source bias voltages may be used to adjust a $V_T$ window of the memory cells. This will further enhance the reliability and longevity of the memory cells.

Figure 11:
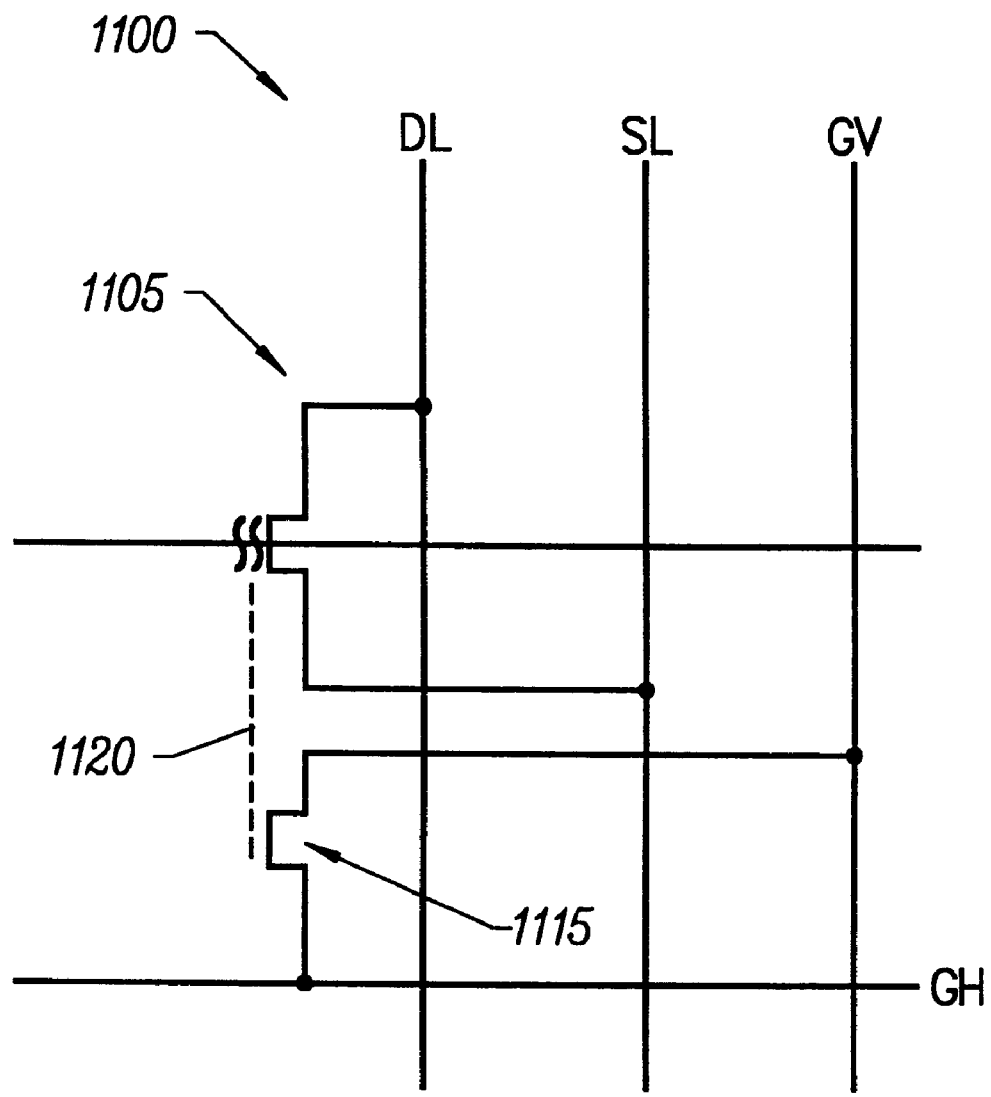
FIG. 11 shows a programmable junction cell using a memory device having multiple oxide thicknesses.

FIG. 11 shows an application of the memory cell of the present invention to form a nonvolatile programmable junction, similar to that described in application Ser. No. 08/741,082, filed Oct. 30, 1996, incorporated herein by reference in its entirety for all purposes.

The programmable junction cell 1100 includes a multiple oxide thickness floating gate memory cell 1105 (coupled between DL and SL) and interconnect element 1115 coupling a GV line and a GH line. Memory cell 1105 and interconnect element 1115 share a floating gate 1120. When floating gate 1120 is programmed (by programming memory cell 1105), interconnect element 1115 decouples GH and GV. When the floating gate 1120 is erased (by erasing memory cell 1105), interconnect element 1120 couples GH and GV together. Logical signals may be passed from GH to GV through interconnect element 1120. Floating gate 1120 may be deeply erased (to a negative VTE) so that full-rail voltages may be passed between GH and GV. The program, erase, and margin operation for memory cell 1105 is as described above. Application Ser. No. 08/741,082 describes in greater detail programmable junction cells.

In other embodiments of the present invention, there may be two or more interconnect elements 1115 sharing the same floating gate of memory cell 1105. Further, multiple interconnect elements 1115 may be arranged in such a way with other programmable junction cells and interconnect elements to perform logical functions, multiplexing, and other more complex functions.

Although a single programmable junction cell is shown in FIG. 11, multiple cells may be arranged in an array form such as that for memory cell 500. An array of cells would be compact and zero-power in normal operation.

The programmable junction cell 1100 may be operated, programmed, erased, evaluated, and characterized using similar techniques as described above.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A programmable junction cell comprising:
a memory cell comprising a floating gate formed over a thick and a thin gate oxide; and
an interconnect element sharing the floating gate, coupling or decoupling a first conductor and a second conductor depending on a configured state of the floating gate wherein when the first conductor is coupled to the second conductor and a positive supply voltage level is placed on the first conductor, the second conductor will be driven to the positive supply voltage level, and when a ground supply voltage level is placed on the first conductor, the second conductor will be driven to the ground supply voltage level.

2. The programmable junction cell of claim 1 wherein the memory cell is a PMOS device.

3. The programmable junction cell of claim 1 wherein the thin gate oxide is about 90 Angstroms tick.

4. The programmable junction cell of claim 1 wherein the thin gate oxide facilitates transfer of electrons between the floating gate and a source region of the memory cell.

5. The programmable junction cell of claim 1 wherein the floating gate overlaps a source region of the memory cell to permit transfer of charge between the floating gate and the source region.

6. The programmable junction cell of claim 1 wherein the positive supply voltage level is a VDD or VCC level of an integrated circuit containing the programmable junction cell.

7. The programmable junction cell of claim 1 wherein the interconnect element is an NMOS transistor.

8. The programmable junction cell of claim 1 wherein the thick gate oxide is about 125 Angstroms thick.

9. The programmable junction cell of claim 1 wherein when the floating gate is in an erased state, the first conductor is coupled to the second conductor.

10. The programmable junction cell of claim 1 wherein when the floating gate is in a programmed state, the first conductor is decoupled from the second conductor.

11. The programmable junction cell of claim 1 wherein the ground supply voltage level is a VSS level of an integrated circuit containing the programmable function cell.

12. The programmable junction cell of claim 1 wherein in an erased state of the floating gate, the interconnect element has a negative threshold voltage.

13. The programmable junction cell of claim 1 wherein when the floating gate is in an erased state, the interconnect element has a threshold voltage in a range from about 0 volts to about −3 volts.

14. The programmable junction cell of claim 1 wherein when the floating gate is in an erased state, the interconnect element has a VT from about −1 volts to about −3 volts.

15. The programmable junction cell of claim 1 wherein to configure the floating gate, a voltage of about 5 volts to about 11 volts is placed at a drain node of the memory cell.

16. The programmable junction cell of claim 1 wherein to configure the floating gate, a current of about 500 microamps to about 1 milliamp is passed through the memory device.

17. The programmable junction cell of claim 1 wherein to configure the floating gate, a current of about 10 microamps or less is passed through the memory device.

18. The programmable junction cell of claim 1 wherein to configure the floating gate, a voltage in a range from about 12 volts to about 18 volts is placed on a control gate of the memory cell, and a voltage of about 2 volts Is placed at a source node of the memory cell.

19. The programmable junction cell of claim 1 wherein to configure the floating gate, a voltage of about 10 volts is placed at a control gate of the memory cell.

20. The programmable junction cell of claim 1 wherein during operation of the programmable junction cell, a voltage from about 1 volt to about 3 volts is placed on a control gate of the memory cell.

21. The programmable junction cell of claim 5 wherein the overlap is about 0.2 microns or less.

22. The programmable junction cell of claim 5 wherein the overlap is about 0.2 microns or more.

23. The programmable junction cell of claim 1 wherein the thin gate oxide of the memory device is about 90 Angstroms and a gate oxide of the interconnect element is from about 50 Angstroms to about 70 Angstroms.

24. The programmable junction cell of claim 1 wherein the thin gate oxide of the memory device is about 90 Angstroms and a gate oxide of the interconnect element is about 50 Angstroms or less.

25. The programmable junction cell of claim 1 wherein the interconnect element has a single gate oxide thickness.

26. A programmable junction cell comprising:
a memory cell comprising a floating gate formed over a thick and a thin gate oxide; and
an NMOS transistor coupled between a first and second conductors and sharing the floating gate, wherein when the floating gate is in an erased state and a positive supply voltage level is placed at the first conductor, the NMOS transistor passes the positive supply voltage level to the second conductor.

27. The programmable junction cell of claim 26 wherein when the floating gate is in a programmed state, the first conductor is decoupled from the second conductor.

28. The programmable junction cell of claim 26 wherein in the erased state, the NMOS transistor has a negative threshold voltage.

29. The programmable junction cell of claim 26 wherein when the floating gate is in an erased state, the NMOS transistor has a threshold voltage in a range from about 0 volts to about −3 volts.

30. The programmable junction cell of claim 26 wherein when the floating gate is in an erased state, the NMOS transistor has a VT from about −1 volts to about −3 volts.

31. The programmable junction cell of claim 26 wherein to configure the floating gate, a voltage of about 5 volts to about 11 volts is placed at a drain node of the memory cell.

32. The programmable junction cell of claim 26 wherein to configure the floating gate, a current of about 500 microamps to about 1 milliamp is passed through the memory device.

33. The programmable junction cell of claim 26 wherein to configure the floating gate, a current of about 10 microamps or less is passed through the memory device.

34. The programmable junction cell of claim 26 wherein during operation of the programmable junction cell, a voltage from about 1 volt to about 3 volts is placed on a control gate of the memory cell.

35. The programmable junction cell of claim 26 wherein the thin gate oxide of the memory device is about 90 Angstroms and a gate oxide of the NMOS transistor is from about 50 Angstroms to about 70 Angstroms.

36. The programmable junction cell of claim 26 wherein the thin gate oxide of the memory device is about 90 Angstroms and a gate oxide of the NMOS transistor is about 50 Angstroms or less.

37. A programmable junction cell comprising:
 a memory cell comprising a floating gate formed over a thick and thin gate oxide; and
 an interconnect element sharing the floating gate, coupling or decoupling a first conductor and a second conductor depending on a configured state of the floating gate, when a gate oxide thickness of the thin gate oxide is different from a gate oxide thickness of the interconnect element.

38. The programmable junction cell of claim 37 wherein the gate oxide thickness of the interconnect element is about 70 Angstroms or less.

39. The programmable junction cell of claim 37 wherein the thickness of the thin gate oxide is greater than the gate oxide thickness of the interconnect element.

40. The programmable junction cell of claim 38 wherein the thickness of the thin gate oxide is greater than the gate oxide thickness of the interconnect element.

41. The programmable junction cell of claim 37 wherein the thick gate oxide has a thickness of about 125 Angstroms.

42. The programmable junction cell of claim 37 wherein the memory cell is a p-channel device.

43. The programmable junction cell of claim 37 wherein when the first conductor is coupled to the second conductor and a positive supply voltage level is placed on the first conductor, the second conductor will be driven to the positive supply voltage level, and when a ground supply voltage level is placed on the first conductor, the second conductor will be driven to the ground supply voltage level.

44. The programmable junction cell of claim 37 wherein when the floating gate is in an erased state, the interconnect element has a threshold voltage in a range from about 0 volts to about −3 volts.

45. The programmable junction cell of claim 37 wherein when the floating gate is in an erased state, the interconnect element has a VT from about −1 volts to about −3 volts.

46. A programmable junction cell comprising:
 a memory cell comprising a floating gate formed over a thick and thin gate oxide, wherein to configure the floating gate, a programming current of about 10 microamps or less is passed through the memory device; and
 an interconnect element sharing the floating gate, coupling or decoupling a first conductor and a second conductor depending on a configured state of the floating gate.

47. The programmable junction cell of claim 46 wherein a gate oxide thickness of the thin oxide is different from a gate oxide thickness of the interconnect element.

48. The programmable junction cell of claim 46 wherein during operation of the programmable junction cell, a voltage from about 1 volt to about 3 volts is placed on a control gate of the memory cell.

49. The programmable junction cell of claim 46 wherein in an erased state of the floating gate, the interconnect element has a negative threshold voltage.

50. A programmable junction cell comprising:
 a memory cell comprising a floating gate formed over a thick and thin gate oxide; and
 an interconnect element sharing the floating gate, coupling or decoupling a first conductor and a second conductor depending on a configured state of the floating gate, wherein in an erased state of the floating gate, the interconnect element has a negative threshold voltage.

51. The programmable junction cell of claim 50 wherein the negative threshold voltage is in a range from about 0 volts to about −3 volts.

52. The programmable junction cell of claim 50 wherein the negative threshold voltage is in a range from about −1 volts to about −3 volts.

53. The programmable junction cell of claim 50 wherein in the erased state, the interconnect element passes full-rail voltages.

54. The programmable junction cell of claim 50 wherein a gate oxide thickness of the thin gate oxide is different from a gate oxide thickness of the interconnect element.

55. The programmable junction cell of claim 50 wherein the interconnect element is an NMOS transistor.

56. The programmable junction cell of claim 50 wherein the memory cell is a PMOS transistor.

* * * * *